United States Patent
Hung et al.

(10) Patent No.: US 7,355,903 B2
(45) Date of Patent: Apr. 8, 2008

(54) SEMICONDUCTOR DEVICE INCLUDING MEMORY CELLS AND CURRENT LIMITER

(75) Inventors: Chun-Hsiung Hung, Hsinchu (TW); Chuan-Ying Yu, Taichung (TW); Han-Sung Chen, Hsinchu (TW); Nai-Ping Kuo, Hsinchu (TW); Ching-Chung Lin, Taipei County (TW); Kuen-Long Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 221 days.

(21) Appl. No.: 11/181,983

(22) Filed: Jul. 15, 2005

(65) Prior Publication Data

US 2007/0014157 A1    Jan. 18, 2007

(51) Int. Cl.
*G11C 7/10* (2006.01)
(52) U.S. Cl. ............... 365/189.06; 365/185.18; 365/185.2
(58) Field of Classification Search ........... 365/189.06, 365/189.09, 185.18, 185.2
See application file for complete search history.

(56) References Cited

U.S. PATENT DOCUMENTS

| | | | |
|---|---|---|---|
| 5,629,893 A * | 5/1997 | Tang et al. ........... | 365/185.29 |
| 5,875,130 A | 2/1999 | Haddad et al. | |
| 6,275,415 B1 | 8/2001 | Haddad et al. | |
| 6,522,585 B2 * | 2/2003 | Pasternak ............. | 365/185.21 |
| 6,587,376 B2 | 7/2003 | Mihnea et al. | |

OTHER PUBLICATIONS

Roberto Bez et al., "Introduction to Flash Memory", IEEE, vol. 91, No. 4, Apr. 2003, pp. 489-502.

* cited by examiner

*Primary Examiner*—Pho M. Luu
(74) *Attorney, Agent, or Firm*—Finnegan, Henderson, Farabow, Garrett & Dunner LLP

(57) ABSTRACT

A semiconductor device, including a memory cell having a control gate, a source and drain; and a current limiting circuit coupled to the source. The current limiting circuit may be configured to limit a current between the drain and source to not exceed a predetermined value; the current being generated in response to application of first and second voltages to the control gate and drain, respectively. The current limiting circuit may include a transistor comprising a first terminal, a second terminal, and a third terminal, wherein the first terminal may include a source of the transistor, the third terminal may include a drain of the transistor, and the second terminal may include a gate of the transistor, and wherein a stable bias may be applied to the second terminal of the transistor.

20 Claims, 4 Drawing Sheets

SEMICONDUCTOR DEVICE INCLUDING MEMORY CELLS AND CURRENT LIMITER

TECHNICAL FIELD

The present invention relates in general to an improved semiconductor device and a method for operating an improved semiconductor device circuit. More specifically, the present invention relates to apparatus and method for limiting a current between a source and a drain of a memory cell to not exceed a predetermined value.

BACKGROUND INFORMATION

A conventional flash EEPROM memory cell typically includes spaced source and drain regions diffused into a semiconductor substrate and a channel region provided therebetween. In addition, the conventional flash memory cell includes an electrically isolated floating gate provided over the channel region, and a control gate disposed above the floating gate. By applying appropriate voltages to the source, drain and control gate, charge is either stored on or removed from the floating gate, and thus data, in the form of such charge, is stored in, or erased from, the memory cell. The presence or absence of charge on the floating gate determines whether current flows between the source and drain regions when the memory cell is selected. Such current can be sensed by appropriate circuitry as a binary "1" stored in the memory cell. Alternatively, if no current is sensed, a binary "0" is considered to be stored in the memory cell. It is also known to arbitrarily associate sensed current and no sensed current with binary "0" and "1", respectively. Multiple EEPROM memory cells are typically combined to form memory arrays.

Typically, EEPROM memory cells are arranged in an array of rows and columns. Bit lines in the array connect the drains of the memory cells in any given column, and word lines connect the gates of the memory cells in any given row. The sources of each memory cell are often connected to ground.

In order to program a particular memory cell, a bit line corresponding to the column in which the selected memory cell is located is typically driven to a relatively high voltage. In addition, a word line associated with the row in which the selected memory cell is located is also driven to a high voltage. Thus, the drain and gate of the selected memory cell, which is located at the intersection of these bit and word lines, are set to high voltages to create a current that supplies charge to the floating gate.

During programming, however, the drains of non-selected memory cells in the column in which the selected memory cell is located also receive the potential of the relatively high voltage bit line. As a result, an off-state or leakage current may flow between the sources and drains of those nonselected memory cells. Although the leakage current associated with a single memory cell may be minimal, collectively, the leakage currents through each nonselected cell can approximate or even exceed the current flowing in the selected memory cell. Accordingly, a charge pump circuit that supplies the bit line programming voltage may not be able to maintain that voltage at a sufficiently high level to insure adequate memory cell programming.

A larger charge pump circuit may be provided in order to generate a higher bit line programming voltage. The larger charge pump circuit, however, would occupy more chip area, thereby limiting the number of memory cells that can be provided on a semiconductor chip.

The present invention is directed to overcome one or more of the problems of the prior art.

SUMMARY OF THE INVENTION

Consistent with an aspect of the present invention, a semiconductor device, comprising a memory cell including a control gate, a source and drain, and a current limiting circuit coupled to the source, the current limiting circuit being configured to limit a current between the drain and source to not exceed a predetermined value, the current being generated in response to application of first and second voltages to the control gate and drain, respectively.

Consistent with another aspect of the present invention, a semiconductor device, comprising an array of memory cells arranged in rows and columns, each of the memory cells including a source, a drain, and a gate, a plurality of word lines, each of the plurality of word lines respectively corresponding to one of the rows of the memory cells, pluralities of gates of the memory cells respectively corresponding to one of the rows of the memory cells being connected to a corresponding one of the plurality of word lines, a plurality of bit lines, each of the plurality of bit lines respectively corresponding to one of the columns of the memory cells, pluralities of the drains respectively corresponding to one of the columns of the memory cells being connected to a corresponding one of the plurality of bit lines, a source line, the sources of the memory cells being coupled together and to the source line, the source line being coupled to a voltage reference, and a current limiter coupled between the source line and the voltage reference.

Additional features and advantages of the invention will be set forth in the description that follows, being apparent from the description or learned by practice of the invention. The features and other advantages of the invention will be realized and attained by the semiconductor devices and methods of manufacture particularly pointed out in the written description and claims, as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

In the disclosed embodiments, a current limiting circuit is provided on a source side of a flash EEPROM memory cell, and is coupled between the source and ground. The current limiting circuit prevents excess leakage current drawn by nonselected cells from overloading the charge pump circuit. As a result, the risk of failure of the charge pump circuit is substantially reduced. In addition, the charge pump circuit size can be reduced, thereby improving chip density.

Figure 1:
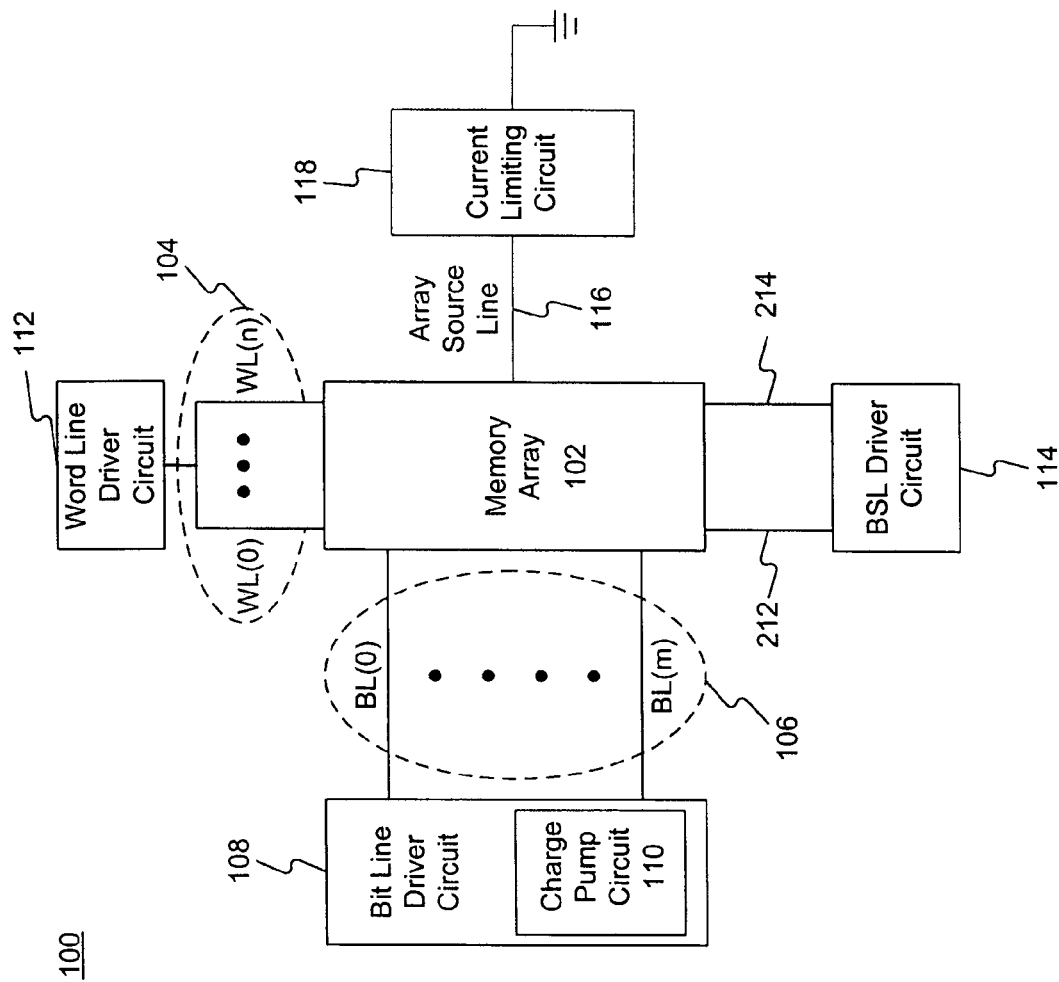
FIG. 1 schematically illustrates a memory array including a current limiting circuit in accordance with an embodiment consistent with the present invention.

Reference will now be made in detail to embodiments of the present invention, examples of which are illustrated in the accompanying drawings. FIG. 1 illustrates an exemplary structure and method for programming a single memory cell of a flash EEPROM memory array using a current limiting circuit.

With reference to FIG. 1, a flash EEPROM memory device 100 includes an array 102 of memory cells, for example, EEPROM or flash memory cells. Each memory cell typically includes a source, a drain, and a channel region between the source and drain. An electrically isolated floating gate is provided over the channel region and a control gate is disposed over the floating gate. Array 102 further includes a plurality of word lines 104, e.g., word lines WL (0), WL(1), . . . , WL (n), and a plurality of bit lines 106, e.g., BL (0), BL (1), . . . , BL (m).

Figure 2:
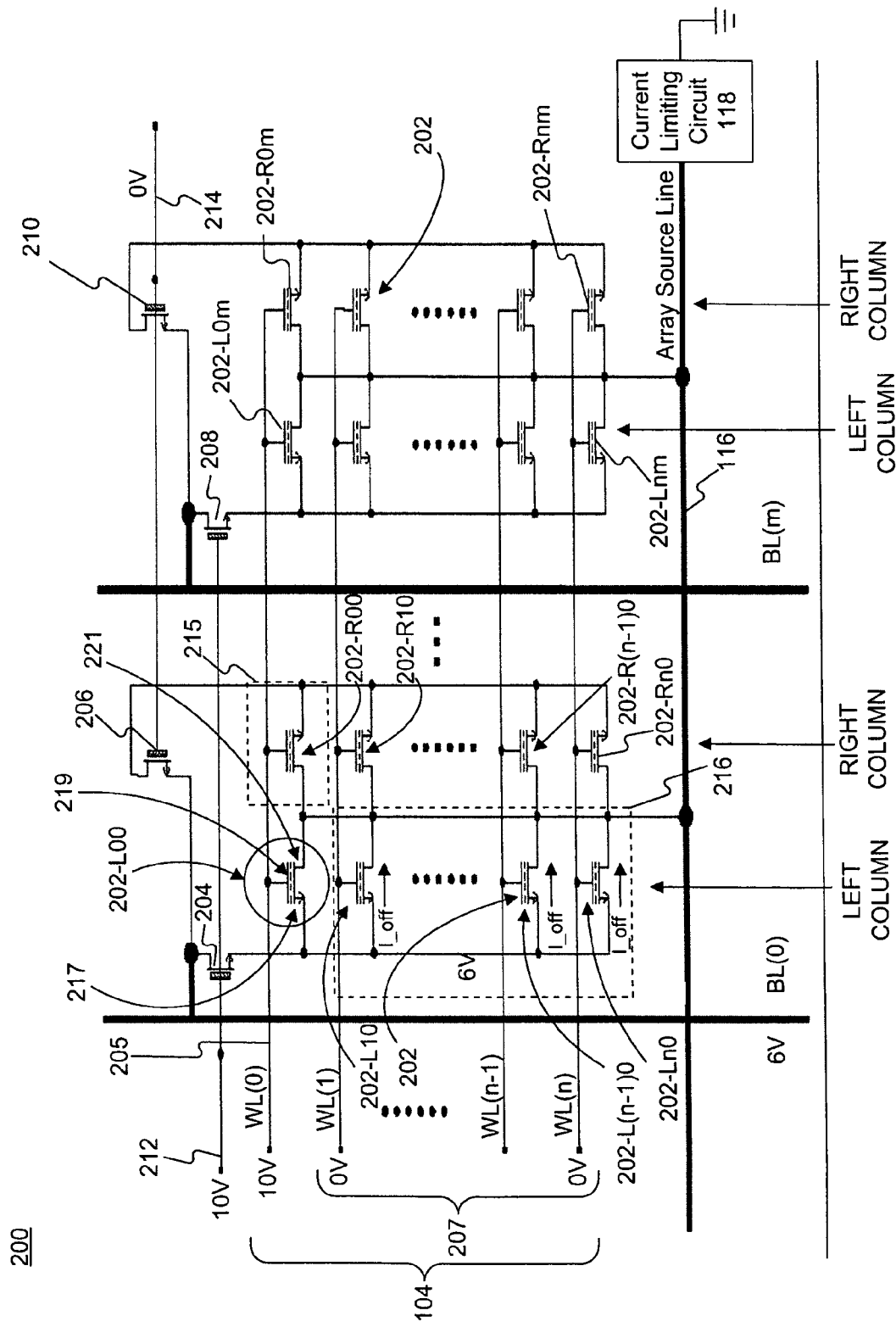
FIG. 2 illustrates an exemplary mode of operation of a memory array including a current limiting circuit in accordance with an embodiment consistent with the present invention.

FIG. 2 illustrates a portion 200 of array 102 in greater detail. In portion 200, array 102 includes a plurality of flash memory cells 202 arranged in rows and columns. A first column of cells 202 contain cells 202-L00 through 202-Ln0, which are respectively coupled to word lines WL(0) through WL(n), and which are referred to herein as a block of memory cells. A second column of cells contains cells which have their respective sources coupled to the sources of corresponding cells in the first column. The cells of the first and second columns are all associated with bit line BL (0) and are designated left (L) and right (R) cells, respectively. The cells of the second column are designated 202-R00 through 202-Rn0, and constitute another block of memory cells. Thus, each cell 202 is designated by "L" or "R" to indicate whether it is in the left or right column and is further designated by two digits to indicate the word line and bit line with which the cell is associated. Since cells of the two columns described thus far are associated with bit line BL(0), their second designating digit is "0".

The respective drains of cells 202-L00 through 202-Ln0 are coupled together and to bit line BL(0) through a block select transistor 204. Similarly, the respective drains of cells 202-R00 through 202-Rn0 are coupled together and to bit line BL(0) through a block select transistor 206. This arrangement of pairs of columns of memory cells respectively associated with bit lines is repeated across memory array 102. Thus, as shown in FIG. 2, a left column of memory cells 202-L0m through 202-Lmn have their respective drains coupled together and to bit line BL (m) through a block select transistor 208. Further, a corresponding right column of memory cells 202-R0m through 202-Rnm have their respective drains coupled together and to bit line BL (m) through a block select transistor 210.

A block select line 212 is coupled to the respective gates of the block select transistors coupled between bit lines and the left column of memory cells of each memory cell block, e.g., block select transistors 204 and 208, to control operation of those block select transistors. A block select line 214 is coupled to the respective gates of the block select transistors coupled between bit lines and the right column of memory cells of each memory cell block, e.g., block select transistors 206 and 210, to control operation of those block select transistors.

Referring also to FIG. 1, bit lines BL(0)-BL(m) are connected to a bit line driver circuit 108 which includes one or more charge pump circuits 110 controlled by additional circuitry in bit line driver circuit 108. Each charge pump circuit 110 generates the relatively high voltages required for operation of the flash memory cells, such as read, program or write, and erase operations. In accordance with logic (not shown) both applied to and contained in driver circuit 108, the voltages generated by charge pump circuit 110 can be applied selectively to one ore more of bit lines BL(0)-BL (m). A word line driver circuit 112, which serves as an addressing circuit, can selectively apply voltages to WL(0)-WL(n), and thereby applies a bias voltage to the gates of memory cells connected to a selected WL. A block select line (BSL) driver circuit 114 selects a single column of memory cells within memory array 102 by applying a potential to, for example, block select line 212 or block select line 214. Word line driver circuit 112, block select driver circuit 114, and bit line driver circuit 108, can simultaneously and selectively provide different voltages to word lines WL(0)-WL(n), block select lines 212 and 214, and bit lines BL(0)-BL(m), respectively. The sources of memory cells 202 within each block of memory cells are coupled together and to an array source line 116. A current limiting circuit 118 is coupled between array source line 116 and a voltage reference such as ground.

Operation of memory device 100 is described next with reference to FIG. 2. In FIG. 2, cell 202-L00 is a memory cell selected for programming. Selected cell 202-L00 is programmed by applying higher bias voltages to block select line 212, word line WL(0), and bit line BL(0), and applying lower bias voltages to block select line 214, nonselected word lines WL(1)-WL(n), and nonselected bit lines BL(1)-BL(m). The bias voltages can be, for example, 10V, 6V, 10 V, 0V, 0V and 0V, applied to WL(0), BL(0), line 212, line 214, WL(1)-WL(n) 207, and BL(1)-BL(m) respectively. The bias voltages applied to WL(0)-WL(n) and BL(0)-BL(m), as well as to block select lines 212 and 214 are provided by, for example, word line driver circuit 112, bit line driver circuit 108 (including charge pump circuit 110), and BSL driver circuit 114, respectively, as shown in FIG. 1. During programming, a potential is provided by word line WL(0) to the gate of selected cell 202-L00 as well as to the gates of the remaining nonselected memory cells coupled to WL(0), to facilitate electron injection in selected cell 202-L00.

The bias voltage, e.g., 6V, is applied by bit line BL(0) through block select transistor 204 to the drain of selected cell 202-L00, as one of the voltages required for programming cell 202-L00. Since the respective drains of nonselected cells 202-L10, . . . 202-Ln0 are all connected to the drain of selected cell 202-L00, collectively designated nonselected cells 216, those nonselected cells also receive on their respective drains the bit line BL(0) voltage. That bit line voltage applied to the respective drains of the nonselected memory cells 216 increases the drain-to-source potential (Vds) of each of nonselected memory cells 216. The value of Vds during programming is sufficient to increase an off-state leakage current of nonselected memory cells 216. In accordance with the illustrated embodiment, however, the provision of current limiting circuit 118 limits the magnitude of that leakage current. As shown in FIG. 2, with Vds applied, each of nonselected memory cells 216 produces an off-state leakage current I_off which flows from the drain and out the source of each of nonselected memory cells 216.

The sum of these I_off currents, as well as a programming current flowing through selected cell 202-L00, flow together through array source line 116 to ground, since the respective sources of the cells are coupled together and to array source line 116. Current limiting circuit 118 limits the sum of the I_off currents to not exceed a desired predetermined value, because it is coupled in series in array source line 116. As a result, the amount of current that charge pump circuit 110 needs to provide to satisfy the sum of the I_off currents is limited by current limiting circuit 118.

Figure 3:
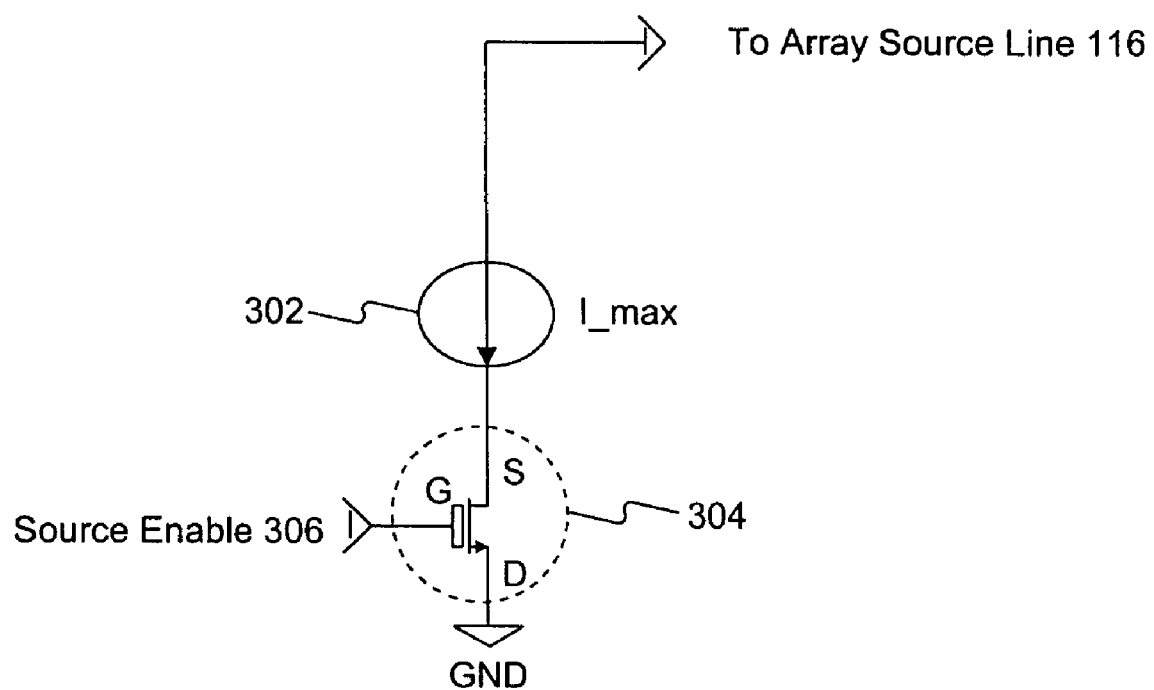
FIG. 3 illustrates a schematic diagram of a current limiting circuit in accordance with an embodiment consistent with the present invention.

FIG. 3 illustrates a schematic diagram of an embodiment of current limiting circuit 118, provided as a current limiting circuit 300. Circuit 300 includes a current limiting element 302 and a MOS transistor 304 coupled in series between array source line 116 and ground. MOS transistor has three terminals, a first terminal, a second terminal and a third terminal, which may correspond to a source, a gate and a drain, respectively. MOS transistor 304 is oriented with its source (S) coupled to element 302 and its drain (D) coupled to ground. A gate G of transistor 304 is coupled to receive a source enable signal 306. Current limiting element 302 has a fixed impedance value selected to limit the summed source currents to a predetermined value, as noted above. As a result, the summed source currents are limited. Thus, the voltage output demand on charge pump circuit 110 is limited as well.

In operation, source enable signal 306 is generated with other logic signals to control operation of memory device 100, to selectively turn transistor 304 on and off to respectively provide and block the source current path to ground. Enable signal 306 may be, for example, at a VCC level which causes transistor 304 to turn on. Enable signal 306 may also be at a 0V level, thereby turning off transistor 304.

Figure 4:
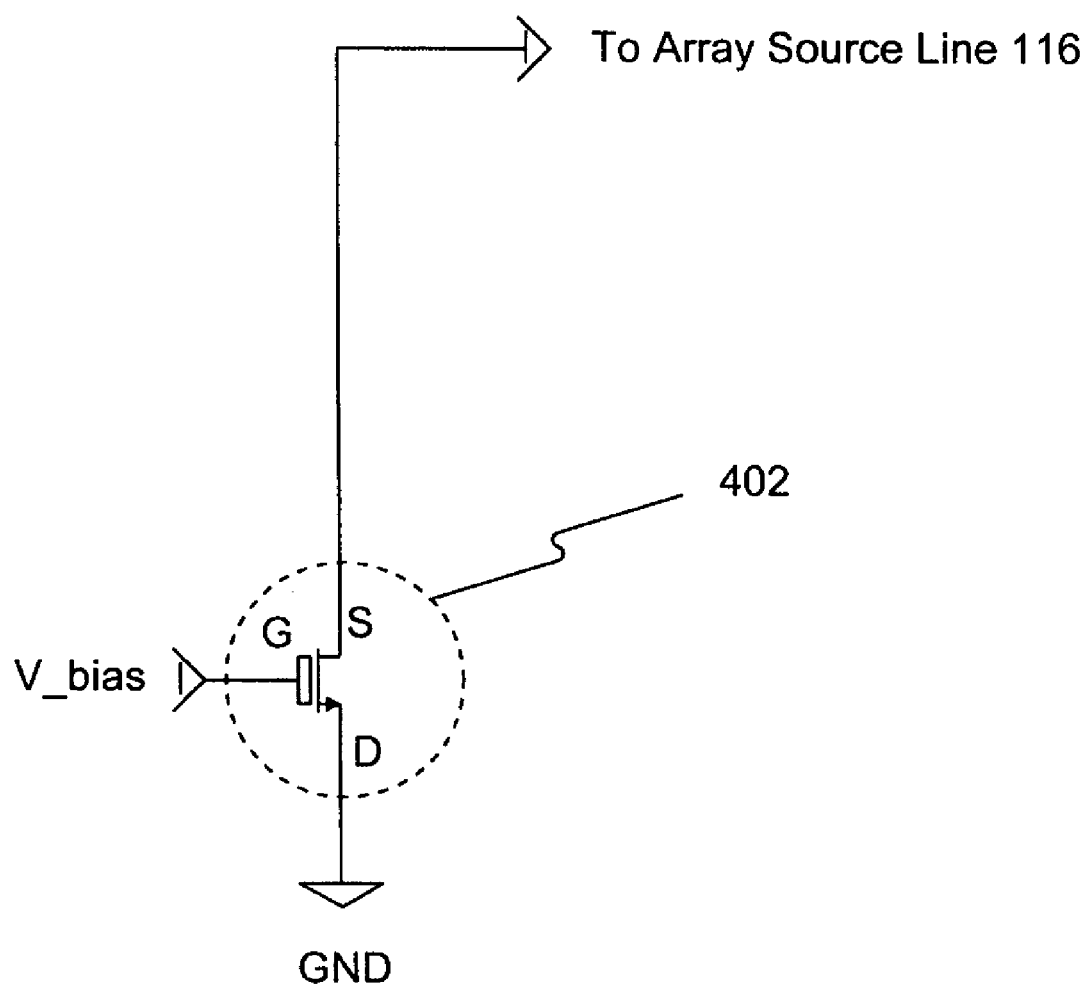
FIG. 4 illustrates a schematic diagram of an alternative embodiment of a current limiting circuit consistent with the present invention.

FIG. 4 illustrates a schematic of an embodiment of current limiting circuit 118, provided as a current limiting circuit 400. Circuit 400 includes an MOS transistor 402 with its source (S) coupled to array source line 116 and its drain (D) coupled to ground. A gate (G) of transistor 402 is coupled to receive a bias voltage V_bias. Typically, V_bias is a stable reference voltage such that the gate-to-source voltage (Vgs) of transistor 402 is substantially constant, and thus the maximum current flowing through transistor 402 can be limited to a fixed value.

Current limiting element 302 may also include transistor 402, having its source (S) connected to source array line 116 and its gate (G) coupled to the bias voltage V_bias. The drain (D) of transistor 402, however, in this case, may be connected to source (S) of transistor 304.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
    a memory cell including a control gate, a source and drain; and
    a current limiting circuit coupled to said source,
        said current limiting circuit being configured to limit a current between said drain and source to not exceed a predetermined value, said current being generated in response to application of first and second voltages to the control gate and drain, respectively, and said current limiting circuit including a transistor comprising a first terminal, a second terminal, and a third terminal, wherein the first terminal includes a source of the transistor, the third terminal includes a drain of the transistor, and the second terminal is a gate of the transistor, and wherein a stable bias is applied to the second terminal of the transistor.

2. A semiconductor device in accordance with claim 1, wherein the memory cell is an EEPROM cell.

3. A semiconductor device in accordance with claim 1, wherein the third terminal is connected to a reference voltage.

4. A semiconductor device in accordance with claim 3, wherein the reference voltage is ground.

5. A semiconductor device, comprising:
    an array of memory cells arranged in rows and columns, each of the memory cells including a source, a drain, and a gate,
    a plurality of word lines, each of the plurality of word lines respectively corresponding to one of the rows of the memory cells, pluralities of gates of the memory cells respectively corresponding to one of the rows of the memory cells being connected to a corresponding one of the plurality of word lines;
    a plurality of bit lines, each of the plurality of bit lines respectively corresponding to one of the columns of the memory cells, pluralities of the drains of the memory cells respectively corresponding to one of the columns of the memory cells being connected to a corresponding one of the plurality of bit lines;
    a source line, the sources of the memory cells being coupled together and to the source line, the source line being coupled to a voltage reference; and
    a current limiter coupled between the source line and the voltage reference.

6. The semiconductor device of claim 5, wherein the memory cells are flash memory cells and the semiconductor device further comprising a bit line driver circuit, coupled to the plurality of bit lines, to generate a bias voltage for application to one of the plurality of bit lines during one of a read, write, and erase operation.

7. The semiconductor device of claim 6, wherein the bit line driver circuit includes a charge pump circuit to generate the bias voltage.

8. The semiconductor device of claim 7, further comprising a word line driver circuit configured to supply a word line voltage to one of the plurality of word lines,
    wherein a selected one of the memory cells has a gate connected to said one of the plurality of word lines, and the drain of the selected one of the memory cells is connected to said one of the plurality of bit lines,
    the bit line driver circuit applies the bias voltage to the one of the plurality of bit lines, and
    a plurality of other memory cells in the array of memory cells respectively produce corresponding leakage currents at their respective sources, a sum of the leakage currents having a magnitude limited by the current limiter.

9. The semiconductor device of claim 5, further comprising first and second select transistors,
    wherein one of the columns of memory cells is a first column and a one of the plurality of bit lines coupled to drains of the memory cells of the first column is a first bit line, and
    memory cells associated with a second one of the columns of memory cells have their respective drains coupled together and their respective sources coupled together, the respective sources of the second one of the columns of memory cells being coupled to the respective sources of the first column of memory cells, the drains of the first column of memory cells coupled to the first bit line through a first select transistor and the drains of the second one of the columns of memory cells coupled to the first bit line through a second select transistor.

10. The semiconductor device of claim 9, wherein the memory cells are flash memory cells; the semiconductor device further comprising a bit line driver circuit, coupled to the plurality of bit lines, to generate a bias voltage for application to at least one of the plurality of bit lines during one of a read, write, and erase operation.

11. The semiconductor device of claim 10, wherein the bit line driver circuit includes a charge pump circuit to generate the bias voltage.

12. The semiconductor device of claim 11, further including:
a word line driver circuit to generate a voltage to apply to said one of the plurality of word lines a word line to which a selected one of the memory cells is coupled;
wherein when the bit line driver circuit applies the bias voltage to the bit line coupled to the selected memory cell, at least one of the memory cells of the column with the selected cell produces a leakage current on its respective source having a magnitude limited by the current limiter.

13. The semiconductor device of claim 5, wherein the current limiter comprises a current limiting element.

14. The semiconductor device of claim 13, wherein the current limiting element comprise a resistor.

15. The semiconductor device of claim 13, wherein the current limiter further includes a transistor coupled in series with the current limiting element, a gate of the transistor for receiving a signal to turn the transistor on and off and thereby provide and block, respectively, a current path between the source line and the voltage reference.

16. The semiconductor device of claim 13, wherein the current limiting element comprises an MOS transistor coupled in series between the source line and the voltage reference and having a gate coupled to receive a bias voltage causing the MOS transistor to provide an impedance to current flow in the source line.

17. A semiconductor device, comprising:
a memory cell including a control gate, a source and drain; and
a current limiting circuit coupled to said source,
said current limiting circuit being configured to limit a current between said drain and source to not exceed a predetermined value, said current being generated in response to application of first and second voltages to the control gate and drain, respectively, and
said current limiting circuit including a transistor comprising a first terminal, a second terminal, and a third terminal, wherein the first terminal includes a source of the transistor, the third terminal includes a drain of the transistor, and the second terminal is a gate of the transistor, and wherein a bias having a predetermined value is selectively applied to the second terminal of the transistor.

18. A semiconductor device in accordance with claim 17, wherein the memory cell is an EEPROM cell.

19. A semiconductor device in accordance with claim 17, wherein the third terminal is connected to a reference voltage.

20. A semiconductor device in accordance with claim 19, wherein the reference voltage is ground.

* * * * *